United States Patent
Chen et al.

(10) Patent No.: US 8,852,990 B2
(45) Date of Patent: Oct. 7, 2014

(54) METHOD OF FABRICATING SOLAR CELL

(75) Inventors: Wei-Lin Chen, Changhua County (TW);
Chih-Chung Wang, Hsinchu (TW);
Chiu-Te Lee, Hsinchu County (TW);
Ke-Feng Lin, Taipei (TW)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 1 day.

(21) Appl. No.: 13/589,179

(22) Filed: Aug. 20, 2012

(65) Prior Publication Data

US 2014/0051202 A1    Feb. 20, 2014

(51) Int. Cl.
*H01L 31/18*    (2006.01)
*H01L 31/0224*    (2006.01)
*H01L 31/0236*    (2006.01)

(52) U.S. Cl.
CPC .......... *H01L 31/18* (2013.01); *H01L 31/02366* (2013.01)
USPC .............................. 438/71; 438/72; 438/98

(58) Field of Classification Search
CPC ............ H01L 31/18; H01L 31/022425; H01L 31/0232
USPC ................. 438/71–73, 675; 136/256
See application file for complete search history.

(56) References Cited

U.S. PATENT DOCUMENTS

| | | | |
|---|---|---|---|
| 5,882,435 A | 3/1999 | Holdermann | |
| 2009/0120497 A1 | 5/2009 | Schetty, III | |
| 2012/0060911 A1* | 3/2012 | Fu et al. | 136/256 |
| 2012/0085403 A1* | 4/2012 | Sauar et al. | 136/256 |
| 2013/0045562 A1* | 2/2013 | Liu et al. | 438/72 |
| 2013/0244371 A1* | 9/2013 | Sewell et al. | 438/96 |

OTHER PUBLICATIONS

Lin, Fabrication of Metal Grid on Silicon-Based Solar Cell by Electrochemical Deposition and Microcontact Print, 2010.
Nguyen, Formation of a Low Ohmic Contact Nickel Silicide Layer on Textured Silicon Wafers Using Electroless Nickel Plating, 2010.
Deligianni, The Next Frontier: Electrodeposition for Solar Cell Fabrication, 2011.
Posthuma, Current and future metallization challenges and solutions for crystalline cell manufacturing, Feb. 2009.

* cited by examiner

Primary Examiner — Olik Chaudhuri
Assistant Examiner — Christine Enad
(74) Attorney, Agent, or Firm — Winston Hsu; Scott Margo

(57) ABSTRACT

A method of fabricating a solar cell includes the following steps. At first, a substrate including a doped layer is provided. Subsequently, a patterned material layer partially overlapping the doped layer is formed on the substrate, and a first metal layer is conformally formed on the patterned material layer and the doped layer. Furthermore, a patterned mask layer totally overlapping the patterned material layer is formed on the first metal layer, and a second metal layer is formed on the doped layer not overlapped by the patterned material layer. Then, the patterned mask layer, the first metal layer between the patterned mask layer and the patterned material layer and a part of the patterned material layer are removed.

20 Claims, 3 Drawing Sheets

METHOD OF FABRICATING SOLAR CELL

BACKGROUND OF THE INVENTION

1. Field of the Invention

The present invention relates to a method of fabricating a solar cell, and more particularly, to a method of fabricating an electrode structure of a solar cell.

2. Description of the Prior Art

Because of the limited amount of non renewable energy sources, the demand for substitute energy sources increases with time, and among all kinds of substitute energy sources, the biggest potential is in solar energy. The common function of the solar cell (the photovoltaic cell) is to transfer the radiation energy of the sunlight through the semiconductor materials to produce electrical energy. The solar cell may include semiconductor materials such as silicon substrate made of single crystalline silicon, poly crystalline silicon, or amorphous silicon, and electrodes made of conductive paste such as silver (Ag) paste.

Screen printing technology is usually utilized to form the electrodes of solar cells in order to reduce manufacturing costs and time. Manufacturers form a frame having the predetermined patterns at first, and the predetermined patterns could be further printed on the substrate according to the frame. For example, an anti-reflective layer made of silicon nitride is firstly formed on the substrate, and then conductive paste is applied to the substrate through the frame. The predetermined patterns are therefore formed on the substrate. Furthermore, the anti-reflective layer is located between the conductive paste and the substrate. Subsequently, a high temperature heating process, such as a heating process with a processing temperature around 700 degrees (° C.) is performed to burn the anti-reflective layer, so that the conductive paste can pass through the burned anti-reflective layer to form an ohmic contact between the conductive paste and the corresponding substrate surface, accordingly, the predetermined electrode structures including bus bar electrodes and finger electrodes are completed. Finger electrodes formed on the radiation-receiving front surface are usually used to receive and conduct photoelectric currents from the substrate to the bus bar electrodes. However, opaque finger electrodes may cover a part of the radiation-receiving front surface, and the light absorbing area of the solar cell inevitably decreases, thereby adversely affecting the power conversion efficiency of the solar cell. In the conventional solar cells having finger electrodes, the covered area rate of the radiation-receiving front surface is between 7% and 8%. Moreover, with the increasing price of silver paste, the manufacturing costs of electrode structures raise. Additionally, the manufacturing costs of the screen printing technology can be absorbed only through mass production.

Consequently, how to improve the manufacturing process of electrode structures of solar cells in order to increase the light absorbing area and decrease the unit cost of a small production or a customized production is still an important issue in the field.

SUMMARY OF THE INVENTION

An objective of the present invention is therefore to provide a method of fabricating a solar cell in order to increase the light absorbing area and decrease the unit cost for a small amount of production or a customized production.

According to an exemplary embodiment of the present invention, a method of fabricating a solar cell includes the following steps. At first, a substrate including a doped layer is provided. Subsequently, a patterned material layer partially overlapping the doped layer is formed on the substrate, and a first metal layer is overall formed on the patterned material layer and the doped layer. Furthermore, a patterned mask layer totally overlapping the patterned material layer is formed on the first metal layer, and a second metal layer is formed on the doped layer not overlapped by the patterned material layer. After that, the patterned mask layer, the first metal layer between the patterned mask layer and the patterned material layer and a part of the patterned material layer are removed.

The patterned mask layer formed through a photolithography process can replace the conventional frame of the screen printing technology to define the electrode structure patterns of the solar cell in order to form patterns having small width so that the light absorbing area is increased and the power conversion efficiency is enhanced. Furthermore, the ohmic contact in the solar cell of the present invention is formed between the metal silicide layer and the doped layer, which may improve the power conversion efficiency as well. Additionally, the material of the second metal layer (the main part of the electrode structure) may be copper (Cu) in place of silver (Ag) paste, which may reduce the manufacturing cost of the solar cell.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
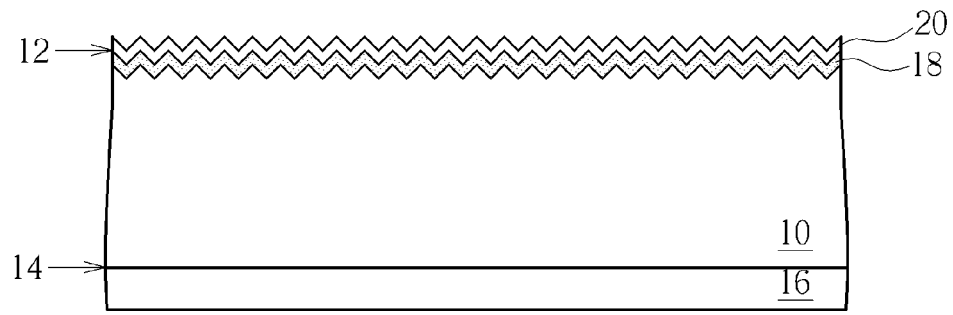
FIG. 1 through FIG. 6 are schematic diagrams illustrating a method of fabricating a solar cell according to a preferred exemplary embodiment of the present invention.

Please refer to FIGS. 1 through 6, which are schematic diagrams illustrating a method of fabricating a solar cell according to a preferred exemplary embodiment of the present invention. As shown in FIG. 1, at first, a substrate 10 is provided. The substrate 10 could be made of single crystalline silicon, poly crystalline silicon, amorphous silicon or other proper semiconductor materials, and the substrate 10 may include wafer, die or any types of substrate. The substrate 10 has a first surface 12 and a second surface 14 opposite to the first surface 12. The first surface 12 may be used as light absorbing surface for receiving radiation from sources such as sunlight or other electromagnetic radiation sources which could be absorbed by the material of the substrate 10. The substrate 10, such as a silicon wafer, may be fabricated by slicing a silicon ingot, therefore a wet etching process is commonly performed to remove the defects such as saw damage on the surfaces of the substrate 10, or the surfaces of the substrate 10 may be firstly oxidized, followed by a wet etching process to remove the oxide layer.

Subsequently, a texture process is performed on the first surface 12 of the substrate 10 to reduce the reflection of the radiations, so that the light absorbing capability of the first surface 12 can be improved. The texture process is not limited to a dry etching process such as a plasma etching process, it could also be a wet etching process, wherein an alkaline etchant solution includes sodium hydroxide (NaOH) and isopropyl alcohol (IPA), or an acid etchant solution includes hydrofluoric acid (HF) and other solvents may serve as etchant as the wet etching process is performed. Additionally, a cleaning step can be further performed to improve the quality of the first surface 12. For example, dilute hydrofluoric acid (DHF) solution or a mixture solution like an SPM solution including sulfuric acid, hydrogen peroxide and deionized water, is used to remove impurities such as native oxide layer or residues caused by the texture process on the first surface 12 of the substrate 10.

After that, a doping process is performed to form a doped layer 18 at the first surface 12 of the substrate 10, the substrate 10 has a first conductive type, and the doped layer 18 has a second conductive type. The first conductivity type could be P-type or N-type and the second conductivity type could be the other one. In this exemplary embodiment, a diffusion furnace tool is used and a process gas, such as phosphorous chloride oxide ($POCl_3$), is provided. An N-type doped layer 18 is therefore formed at the first surface 12 of the P-type substrate 10. The second surface 14 opposite to the first surface 12 may serve as a rear surface of the later formed solar cell, and a rear contact layer 16 such as back side field (BSF) structure could be selectively formed on the second surface 14. The rear contact layer 16 could be a single-layered structure or a multi-layered structure, and the material of the rear contact layer 16 may include metal silicide, metal oxide, other proper materials or a combination thereof.

Figure 2:
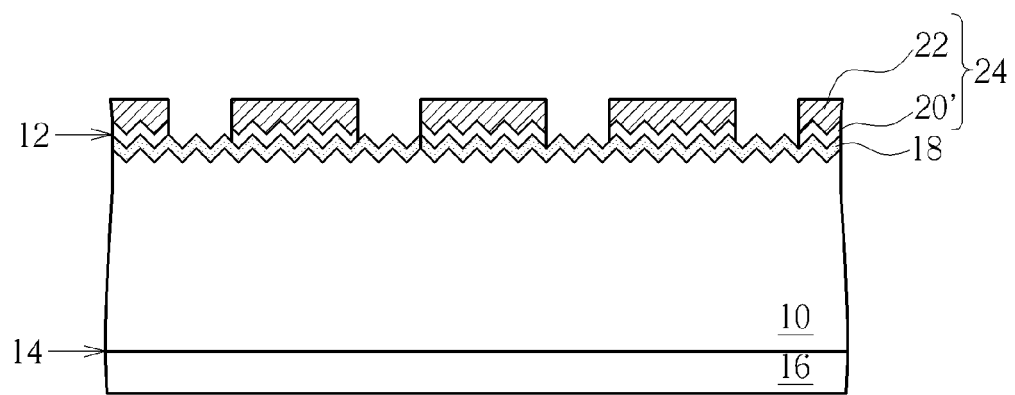

As shown in FIG. 2, a patterned material layer 24 is further formed on the substrate 10, and the method of forming the patterned material layer 24 includes the following steps. At first, please refer to FIG. 1 again, an anti-reflective coating (ARC) layer 20 is conformally formed on the substrate 10. A plasma enhanced chemical vapor deposition (PECVD) process is for example performed to form a silicon nitride layer as the anti-reflective coating layer 20, but not limited thereto. The anti-reflective coating layer 20 could be a single-layered structure made of nitride, oxide or other proper materials, or a multi-layered structure made, for example, of titanium oxide (TiO) and aluminum oxide (AlO) etc. Subsequently, a patterned photoresist layer 22 is formed on the anti-reflective coating layer 20. The material of the patterned photoresist layer 22 may include polyimide (PI). The patterned photoresist layer 22 can serve as a mask and a dry etching process is performed to remove a part of the anti-reflective coating layer 20, i.e. pattern the anti-reflective coating layer 20. A patterned anti-reflective coating layer 20' is therefore formed. In this exemplary embodiment, the patterned material layer 24 includes the patterned anti-reflective coating layer 20' and the patterned photoresist layer 22 overlap each others, and the patterned material layer 24 partially overlaps the doped layer 18. The doped layer 18 not covered by the patterned material layer 24 has an inclined surface or a sawtooth-shaped surface, but not limited thereto. In other exemplary embodiments, the doped layer not covered by the patterned material layer may have a planar surface, and the doped layer covered by the patterned material layer 24 may still have a sawtooth-shaped surface. Furthermore, a doping process is additionally performed on the doped layer having a planar surface, so that a dopant concentration of the doped layer having a planar surface is substantially larger than a dopant concentration of the doped layer having a sawtooth-shaped surface. Accordingly, the doped layer having a planar surface could serve as a selective emitter region of the later formed solar cell.

Figure 3:
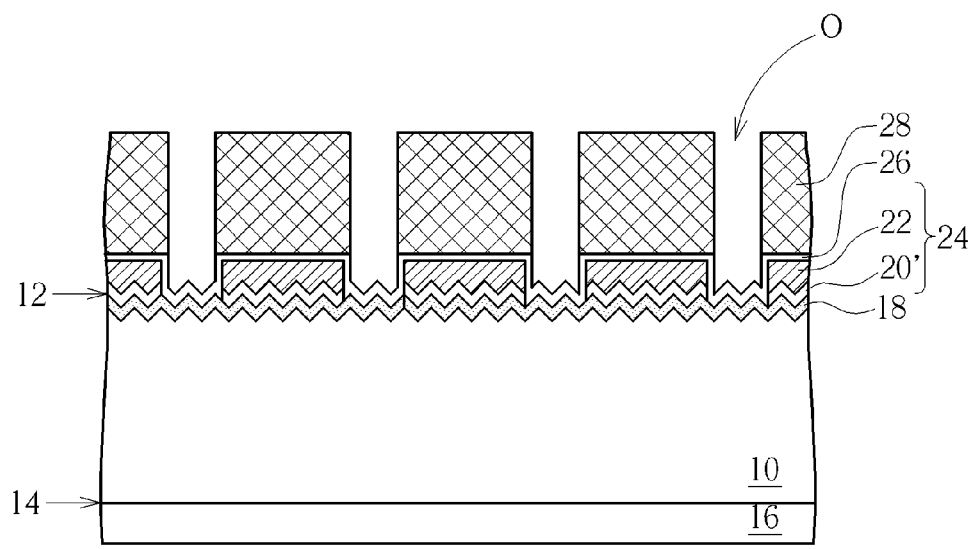

As shown in FIG. 3, a first metal layer 26 is overall formed on the substrate 10 and covers the patterned material layer 24 and the doped layer 18. The first metal layer 26 could be made of a metal material, and the metal material preferably reacts with the substrate 10 to form a metal silicide layer, for example, nickel (Ni), cobalt (Co) or titanium (Ti). The method of forming the first metal layer 26 includes a physical vapor deposition process, such as sputtering process, or an evaporation process, a chemical vapor deposition process, or other thin-film deposition processes. More specifically, the first metal layer 26 covers the patterned material layer 24 and directly contacts the doped layer 18 exposed by the patterned material layer 24. Furthermore, a patterned mask layer 28 is formed on the first metal layer 26, and the patterned mask layer 28 could be a photoresist layer having at least an opening O. A thickness of the patterned mask layer 28 is substantially larger than a thickness of the patterned photoresist layer 22, and the thickness of the patterned mask layer 28 is relative to a predetermined height of the later formed electrode structure.

It is appreciated that, the patterned mask layer 28 totally overlaps the patterned material layer 24. The patterned mask layer 28 and the patterned material layer 24 can be jointly used to define the electrode structure patterns of the later formed solar cell, and the first metal layer 26 exposed by the patterned mask layer 28 may totally cover and directly contact the doped layer 18 exposed by the patterned material layer 24 (as shown in FIG. 2). Furthermore, the patterned mask layer 28 and the patterned photoresist layer 22 of the patterned material layer 24 are respectively formed through lithography process with a mask, therefore, the minimum line width of the patterns in the patterned mask layer 28/the patterned photoresist layer 22, i.e. the minimum width of the opening O, should be corresponding to the minimum exposure limit of the corresponding lithography process. In this exemplary embodiment, the minimum line width of the patterns in the patterned mask layer 28/the patterned photoresist layer 22, i.e. the minimum width of the opening O, could be substantially smaller than the minimum line width of the patterns formed through printing technology, i.e. 80 micrometers (μm). The light absorbing area of the first surface 12 (the radiation-receiving front surface) can therefore be increased. Moreover, when only a part of the electrode structure patterns should be modified, or when it is a small scale production, only a part of the mask corresponding to the changed patterns can be modified, or some of the existing masks are selected to form the required patterns. Accordingly, costs and the time needed for forming a new frame can be saved.

Figure 4:
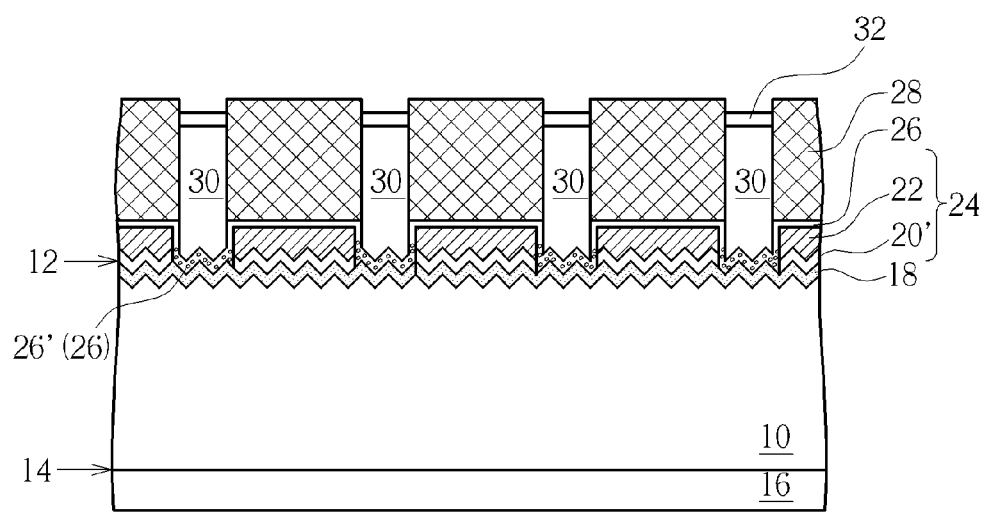

As shown in FIG. 4, a second metal layer 30 is formed on the doped layer 18 not overlapped by the patterned material layer 24. The second metal layer 30 could be made of conductive materials having a low resistivity, and the material of the second metal layer 30 may include copper (Cu), aluminum (Al), silver (Ag), platinum (Pt), gold (Au), an alloy of the illustrated materials or other proper materials. The method of forming the second metal layer 30 can include an electro plating process, an electroless plating process, a chemical plating process or an auto-catalytic plating process. In this exemplary embodiment, an electrochemical deposition process, such as electro-copper plating process, is performed, and the second metal layer 30 made of copper is formed to fill the opening O of the patterned mask layer 28. The first metal layer 26 totally covering the substrate 10 may serve as conductive electrode for the electro plating process, and the patterned mask layer 28 may be used to define where the second metal layer 30 would be formed. The second metal layer 30 can therefore only be formed on the first metal layer 26 exposed by the patterned mask layer 28, i.e. the second metal layer 30 can only be formed in each of the openings O to respectively form an electrode, and each of the openings O is not filled up with the second metal layer 30. In other words, the formed second metal layer 30 does not overlap a top of the patterned mask layer 28. The ratio of a height to a width of the formed electrode is substantially larger than 1.

The material of the first metal layer 26 and the material of the second metal layer 30 are different. In this exemplary embodiment, the first metal layer 26 is made of nickel (Ni), and the second metal layer 30 is made of copper (Cu), but not limited thereto. The formation of the first metal layer 26 can improve the adhesion capability of the second metal layer 30 to the substrate 10, and the first metal layer 26 could be a barrier layer to prevent the metal elements of the second metal layer 30 from diffusing into the doped layer 18. It is appreciated that, in order to reduce the contact resistance between the first metal layer 26 and the substrate 10, a thermal treatment is performed on the first metal layer 26 to transfer a part of the first metal layer 26 such as nickel (Ni) layer to a metal silicide layer 26' such as nickel silicide (NiSi) layer. The metal silicide layer 26' is formed on the doped layer 18 not covered by the patterned material layer 24, and directly contacts the substrate 10. More specifically, the metal silicide layer 26' covers and directly contacts the doped layer 18 (the substrate 10) to form ohmic contacts. Conversely, the silver paste contacts the substrate by passing through the burned anti-reflective layer made of the non-conductive material to form ohmic contacts within the conventional screen printing technology. The electric conductivity of the metal silicide layer 26' is better than the electric conductivity of the anti-reflective layer; therefore, the contact resistance can be reduced. In this exemplary embodiment, in order not to affect the properties of the second metal layer 30, the thermal treatment is preferably performed before the formation of the second metal layer 30, and the second metal layer 30 is later formed between the metal silicide layer 26' and the patterned mask layer 28. Moreover, the silicide layer 26' is between the second metal layer 30 and the doped layer 18. In other exemplary embodiments, for example, the melting point of the material of the second metal layer 30 is higher than the process temperature of the thermal treatment, the second metal layer 30 is formed between the first metal layer 26 and the patterned mask layer 28, and the thermal treatment is performed after the formation of the second metal layer 30. Similarly, the silicide layer 26' is still formed between the second metal layer 30 and the doped layer 18. Additionally, a part of the first metal layer 26 is still between the patterned mask layer 28 and the patterned material layer 24.

Figure 5:
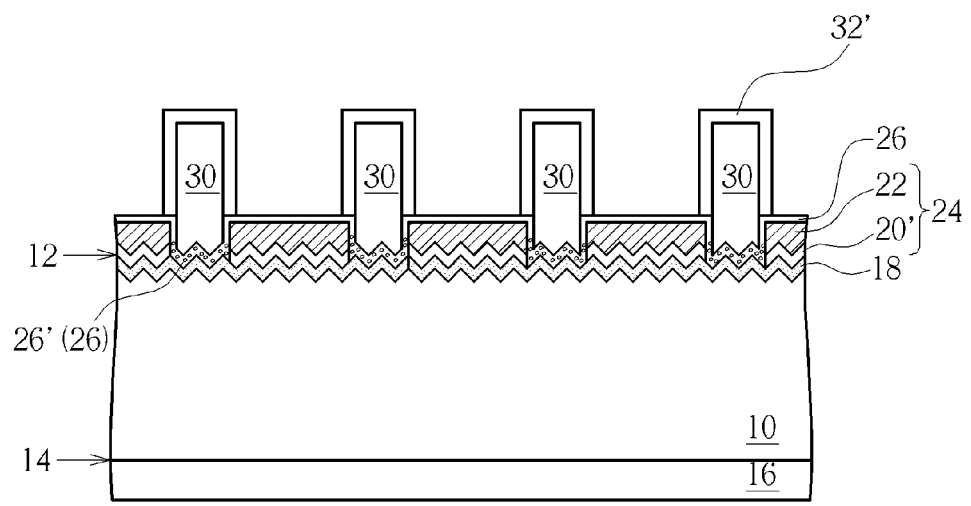

A third metal layer 32 is further formed to cover the second metal layer 30. An electric conductivity of the material of the third metal layer 32 is preferably larger than an electric conductivity of the material of the second metal layer 30 to improve the surface conductivity of the later formed electrode structure. Additionally, a reactivity of the material of the third metal layer 32 is preferably smaller than a reactivity of the material of the second metal layer 30, so that the third metal layer 32 can be used to prevent the oxidation of the second metal layer 30. The second metal layer 30 and the third metal layer 32 may be made of a metal having a good electric conductivity such as aluminum (Al), silver (Ag), platinum (Pt), gold (Au), an alloy of the illustrated materials or other proper materials, and the material of the second metal layer 30 and the material of the third metal layer 32 could be selected according to process requirements. In this exemplary embodiment, the third metal layer 32 made of silver (Ag) covers the top of the second metal layer 30 made of copper (Cu). The method of forming the third metal layer 32 may include a physical vapor deposition process such as sputtering process or an evaporation process, a chemical vapor deposition process, or other thin-film deposition processes. For example, the third metal layer 32 could be formed only on the second metal layer 30 without filling up the opening O of the patterned mask layer 28 through an electro plating process. In another way, the method of forming the third metal layer 32 could include the following steps. At first, an evaporation process is performed to conformally form a metal layer on the patterned mask layer 28 and the second metal layer 30. Subsequently, an etching back process is performed to remove a part of the metal layer. The left metal layer can therefore only be disposed on the second metal layer 30 and fill up the opening O of the patterned mask layer 28 to serve as the third metal layer. In another exemplary embodiment, another electro plating process can be performed after removing the patterned mask layer 28. Accordingly, the formed third metal layer 32' may additionally cover the sidewalls of the second metal layer 30, and the anti-oxidation effect for the second metal layer 30 can be improved. As shown in FIG. 5, the third metal layer 32' formed through multi-electro plating processes can encompass the electrodes made of the second metal layer 30.

Figure 6:
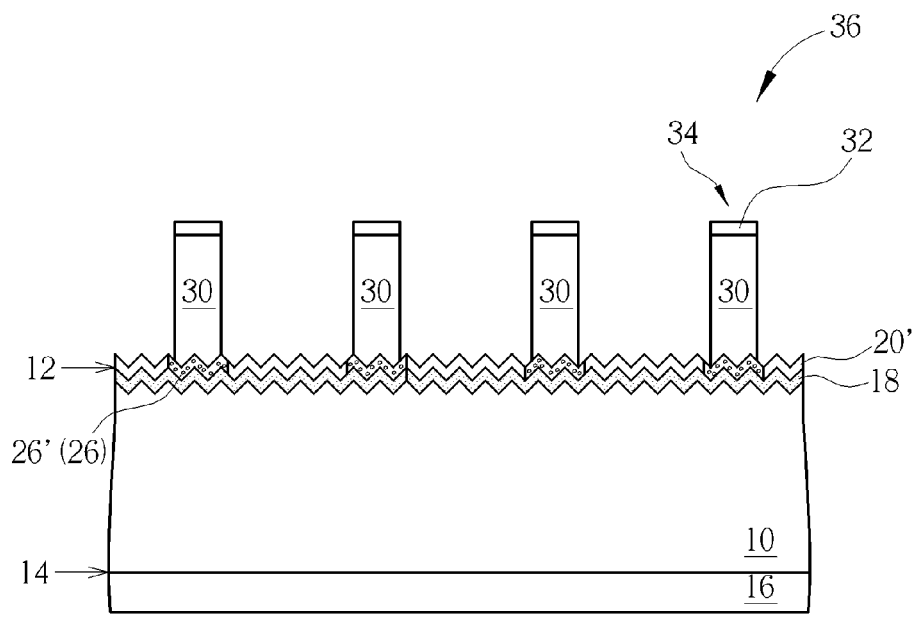

As shown in FIG. 6, the patterned mask layer 28, the first metal layer 26 between the patterned mask layer 28 and the patterned material layer 24 and a part of the patterned material layer 24 are removed to form at least an electrode structure 34. Accordingly, the structure of the solar cell 36 is completed. Each of the electrode structures 34 includes the silicide layer 26', the second metal layer 30 and the third metal layer 32' overlapping each other and being sequentially and directly disposed on a part of the doped layer 18 (the substrate 10), and the doped layer 18 between the electrode structures 34 is covered by the patterned anti-reflective coating layer 20' between the electrode structures. To increase the light absorbing area of the first surface 12, a width of the electrode structure 34 can be appropriately reduced in size (the minimum width relates to the minimum exposure limit of the corresponding lithography process), however, a small width of the electrode structure 34 may induce a high resistance, which may reduce the power conversion efficiency of the solar cell 36, therefore, a height of the electrode structure 34 can be increased to compensate for it. In other words, a width of the opening O of the patterned mask layer 28 corresponding to the width of the electrode structure 34 may be negatively related to a thickness of the second metal layer 30 (i.e. the processing time of the electro-copper plating process for forming the second metal layer 30, when the other process conditions are the same) corresponding to the height of the electrode structure 34. In this exemplary embodiment, in each of the electrode structures 34, the sidewalls of the third metal layer 32 are aligned with the sidewalls of the second metal layer 30 to form an electrode structure having a quasi-rectangular cross-section and protruding from the first surface 12 of the substrate 10, and the height of each of the electrode structures 34 is substantially around 33 micrometers (μm).

In conclusion, in the present invention, the patterned mask layer formed through photolithography processes can replace the conventional frame of the screen printing technology for defining the electrode structure patterns of solar cells, in order to form patterns having smaller widths, thereby increasing the light absorbing area and enhancing the power conversion efficiency. Furthermore, the ohmic contact in the solar cell of the present invention is formed between the metal silicide layer and the doped layer, which may improve the power conversion efficiency as well. Additionally, the material of the second metal layer (the main part of the electrode structure) may be copper (Cu) in place of silver (Ag) paste, which may reduce the manufacturing costs of the solar cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a solar cell, comprising:
   providing a substrate, wherein the substrate comprises a doped layer;
   forming a patterned material layer on the substrate, and the patterned material layer partially overlapping the doped layer, wherein the patterned material layer comprises a plurality of patterned layers;
   conformally forming a first metal layer on the patterned material layer and the doped layer;
   forming a patterned mask layer on the first metal layer, wherein the patterned mask layer totally overlaps the patterned material layer;
   forming a second metal layer on the doped layer not overlapped by the patterned material layer, wherein the second metal layer partially fills at least an opening of the patterned mask layer; and
   removing the patterned mask layer, the first metal layer between the patterned mask layer and the patterned material layer and at least one of the patterned layers of the patterned material layer.

2. The method of fabricating a solar cell according to claim 1, wherein the doped layer is at a surface of the substrate, wherein the substrate has a first conductive type and the doped layer has a second conductive type.

3. The method of fabricating a solar cell according to claim 2, wherein the first conductivity type comprises P-type or N-type and the second conductivity type comprises the other one.

4. The method of fabricating a solar cell according to claim 1, wherein the method of forming the patterned material layer comprises:
   sequentially and conformally forming an anti-reflective coating layer and a patterned photoresist layer on the substrate; and
   using the patterned photoresist layer as a mask to pattern the anti-reflective coating layer.

5. The method of fabricating a solar cell according to claim 4, wherein removing a part of the patterned material layer comprises removing the patterned photoresist layer.

6. The method of fabricating a solar cell according to claim 1, wherein the first metal layer contacts and covers the doped layer exposed by the patterned material layer.

7. The method of fabricating a solar cell according to claim 1, wherein a material of the first metal layer is different from a material of the second metal layer.

8. The method of fabricating a solar cell according to claim 1, wherein a material of the first metal layer reacts with the substrate to form a metal silicide layer.

9. The method of fabricating a solar cell according to claim 1, wherein a material of the second metal layer comprises copper (Cu).

10. The method of fabricating a solar cell according to claim 1, wherein the method of forming the second metal layer comprises electro plating process, electroless plating process, chemical plating process or auto-catalytic plating process.

11. The method of fabricating a solar cell according to claim 1, wherein the formed second metal layer does not overlap a top of the patterned mask layer.

12. The method of fabricating a solar cell according to claim 1, further comprising performing a thermal treatment on the first metal layer to transfer a part of the first metal layer to a metal silicide layer.

13. The method of fabricating a solar cell according to claim 12, wherein the metal silicide layer is between the second metal layer and the doped layer.

14. The method of fabricating a solar cell according to claim 12, wherein the thermal treatment is performed before the formation of the second metal layer, and the second metal layer is formed between the metal silicide layer and the patterned mask layer.

15. The method of fabricating a solar cell according to claim 12, wherein the second metal layer is formed between the first metal layer and the patterned mask layer, and the thermal treatment is performed after the formation of the second metal layer.

16. The method of fabricating a solar cell according to claim 1, wherein the patterned mask layer comprises at least an opening, and the second metal layer is formed to fill the opening for forming an electrode.

17. The method of fabricating a solar cell according to claim 1, further comprising forming a third metal layer covering the second metal layer.

18. The method of fabricating a solar cell according to claim 17, wherein a reactivity of a material of the third metal layer is smaller than a reactivity of a material of the second metal layer.

19. The method of fabricating a solar cell according to claim 17, wherein a material of the third metal layer comprises silver (Ag).

20. The method of fabricating a solar cell according to claim 17, wherein sidewalls of the third metal layer and sidewalls of the second metal layer are aligned.

* * * * *